US010979829B2

(12) United States Patent
Asnes

(10) Patent No.: US 10,979,829 B2
(45) **Date of Patent: *Apr. 13, 2021**

(54) BONE CONDUCTION DEVICE INCLUDING A BALANCED ELECTROMAGNETIC ACTUATOR HAVING RADIAL AND AXIAL AIR GAPS

(71) Applicant: Cochlear Limited, Macquarie University (AU)

(72) Inventor: Kristian Asnes, Molndal (SE)

(73) Assignee: Cochlear Limited, Macquarie University (AU)

( * ) Notice: Subject to any disclaimer, the term of this patent is extended or adjusted under 35 U.S.C. 154(b) by 0 days.

This patent is subject to a terminal disclaimer.

(21) Appl. No.: 16/240,894

(22) Filed: Jan. 7, 2019

(65) Prior Publication Data

US 2019/0215625 A1 Jul. 11, 2019

Related U.S. Application Data

(60) Continuation of application No. 15/262,786, filed on Sep. 12, 2016, now Pat. No. 10,178,484, which is a (Continued)

(51) Int. Cl.

*H04R 25/00* (2006.01)
*H04R 9/02* (2006.01)

(Continued)

(52) U.S. Cl.

CPC ............. *H04R 25/606* (2013.01); *H04R 1/46* (2013.01); *H04R 9/025* (2013.01); *H04R 9/027* (2013.01);

(Continued)

(58) Field of Classification Search

CPC ........ H04R 9/025; H04R 1/46; H04R 25/606; H04R 2209/022; H04R 9/027; H04R 9/066; H04R 2460/13

See application file for complete search history.

(56) References Cited

U.S. PATENT DOCUMENTS

| | | | |
|---|---|---|---|
| 905,781 | A | 12/1908 | Baldwin |
| 4,129,187 | A | 12/1978 | Wengryn et al. |

(Continued)

FOREIGN PATENT DOCUMENTS

| | | | |
|---|---|---|---|
| CN | 101931837 | A | 12/2010 |
| DE | 19541882 | A1 | 5/1997 |

(Continued)

*Primary Examiner* — Tuan D Nguyen

(74) *Attorney, Agent, or Firm* — Pilloff Passino & Cosenza LLP; Martin J. Cosenza

(57) ABSTRACT

A bone conduction device configured to couple to an abutment of an anchor system anchored to a recipient's skull. The bone conduction device includes a vibrating electromagnetic actuator configured to vibrate in response to sound signals received by the bone conduction device, and a coupling apparatus configured to attach the bone conduction device to the abutment so as to impart to the recipient's skull vibrations generated by the vibrating electromagnetic actuator. The vibrating electromagnetic actuator includes a bobbin assembly and a counterweight assembly. Two axial air gaps are located between the bobbin assembly and the counterweight assembly and two radial air gaps are located between the bobbin assembly and the counterweight assembly. No substantial amount of the dynamic magnetic flux passes through the radial air gaps.

20 Claims, 16 Drawing Sheets

Related U.S. Application Data division of application No. 14/589,475, filed on Jan. 5, 2015, now Pat. No. 9,445,207, which is a continuation of application No. 13/804,404, filed on Mar. 14, 2013, now Pat. No. 8,929,577, which is a continuation of application No. 13/049,535, filed on Mar. 16, 2011, now Pat. No. 8,565,461.

(51) Int. Cl.
*H04R 1/46* (2006.01)
*H04R 9/06* (2006.01)

(52) U.S. Cl.
CPC ........ *H04R 9/066* (2013.01); *H04R 2209/022* (2013.01); *H04R 2460/13* (2013.01)

(56) References Cited

U.S. PATENT DOCUMENTS

| | | | |
|---|---|---|---|
| 4,425,482 | A | 1/1984 | Bordelon et al. |
| 4,476,451 | A | 10/1984 | Kosugi |
| 5,338,287 | A | 8/1994 | Miller et al. |
| 5,535,097 | A | 7/1996 | Ruben et al. |
| 5,809,157 | A | 9/1998 | Grumazescu |
| 5,814,907 | A | 9/1998 | Bandera |
| 5,913,815 | A | 6/1999 | Ball et al. |
| 5,947,155 | A | 9/1999 | Miki et al. |
| 5,960,875 | A | 10/1999 | Beauquin et al. |
| 6,002,184 | A | 12/1999 | Delson et al. |
| 6,751,334 | B2 | 6/2004 | Hakansson |
| 6,985,599 | B2 | 1/2006 | Asnes |
| 7,319,771 | B2 | 1/2008 | Asnes |
| 8,565,461 | B2 | 10/2013 | Asnes |
| 8,929,577 | B2 | 1/2015 | Asnes |
| 2003/0034705 | A1 | 2/2003 | Hakansson |
| 2004/0032962 | A1 | 2/2004 | Westerkull |
| 2004/0057588 | A1 | 3/2004 | Asnes |
| 2005/0135651 | A1 | 6/2005 | Hakansson |
| 2006/0045298 | A1 | 3/2006 | Westerkull |
| 2006/0208600 | A1 | 9/2006 | Sahyoun |
| 2007/0053536 | A1 | 3/2007 | Westerkull |
| 2009/0064484 | A1 | 3/2009 | Hakansson |
| 2009/0209806 | A1 | 8/2009 | Hakansson |
| 2010/0054509 | A1 * | 3/2010 | Thompson ............. H04R 11/02 381/312 |
| 2010/0145135 | A1 | 6/2010 | Ball et al. |
| 2010/0284554 | A1 * | 11/2010 | Aston ..................... H01L 41/12 381/190 |
| 2011/0268303 | A1 | 11/2011 | Ahsani |
| 2012/0237067 | A1 | 9/2012 | Asnes |
| 2012/0302822 | A1 | 11/2012 | Van Himbeeck et al. |
| 2014/0270297 | A1 | 9/2014 | Gustafsson et al. |
| 2014/0275731 | A1 | 9/2014 | Andersson et al. |

FOREIGN PATENT DOCUMENTS

| | | | |
|---|---|---|---|
| DE | 202004006117 | U1 | 7/2004 |
| DE | 102006026288 | A1 | 1/2007 |
| EP | 1965604 | A1 | 9/2008 |
| JP | 2010118877 | A | 5/2010 |
| JP | 2012044245 | A | 3/2012 |
| KR | 100872762 | B1 | 12/2008 |
| TW | 201215174 | A | 4/2012 |
| WO | 9834320 | A2 | 8/1998 |
| WO | 9909785 | A1 | 2/1999 |
| WO | 0167813 | A1 | 9/2001 |
| WO | 03096744 | A1 | 11/2003 |
| WO | 2009110705 | A2 | 9/2009 |
| WO | 2012030270 | A1 | 3/2012 |
| WO | 2012160542 | A2 | 11/2012 |

* cited by examiner

BONE CONDUCTION DEVICE INCLUDING A BALANCED ELECTROMAGNETIC ACTUATOR HAVING RADIAL AND AXIAL AIR GAPS

CROSS-REFERENCE TO RELATED APPLICATIONS

The present application is a Continuation of U.S. patent application Ser. No. 15/262,786, filed on Sep. 12, 2016, which is a Divisional Application of U.S. patent application Ser. No. 14/589,475, filed Jan. 5, 2015, naming Kristian ASNES as an inventor, which is a Continuation Application of U.S. application Ser. No. 13/804,404, filed Mar. 14, 2013, now U.S. Pat. No. 8,929,577, which in turn is a Continuation Application of U.S. application Ser. No. 13/049,535, filed Mar. 16, 2011, now U.S. Pat. No. 8,565,461. The entire contents of these applications are incorporated herein by reference in their entirety.

BACKGROUND

Field of the Invention

The present invention relates generally to hearing prostheses, and more particularly, to a bone conduction device having an electromagnetic actuator having radial and axial air gaps.

Related Art

Hearing loss, which may be due to many different causes, is generally of two types: conductive and sensorineural. Sensorineural hearing loss is due to the absence or destruction of the hair cells in the cochlea that transduce sound signals into nerve impulses. Various hearing prostheses are commercially available to provide individuals suffering from sensorineural hearing loss with the ability to perceive sound. For example, cochlear implants use an electrode array implanted in the cochlea of a recipient to bypass the mechanisms of the ear. More specifically, an electrical stimulus is provided via the electrode array to the auditory nerve, thereby causing a hearing percept.

Conductive hearing loss occurs when the normal mechanical pathways that provide sound to hair cells in the cochlea are impeded, for example, by damage to the ossicular chain or ear canal. Individuals suffering from conductive hearing loss may retain some form of residual hearing because the hair cells in the cochlea may remain undamaged.

Individuals suffering from conductive hearing loss typically receive an acoustic hearing aid. Hearing aids rely on principles of air conduction to transmit acoustic signals to the cochlea. In particular, a hearing aid typically uses an arrangement positioned in the recipient's ear canal or on the outer ear to amplify a sound received by the outer ear of the recipient. This amplified sound reaches the cochlea causing motion of the perilymph and stimulation of the auditory nerve.

In contrast to hearing aids, which rely primarily on the principles of air conduction, certain types of hearing prostheses commonly referred to as bone conduction devices, convert a received sound into vibrations. The vibrations are transferred through the skull to the cochlea causing generation of nerve impulses, which result in the perception of the received sound. Bone conduction devices are suitable to treat a variety of types of hearing loss and may be suitable for individuals who cannot derive sufficient benefit from acoustic hearing aids, cochlear implants, etc., or for individuals who suffer from stuttering problems.

SUMMARY

In accordance with one aspect of the present invention, there is a bone conduction device comprising a first assembly configured to generate a dynamic magnetic flux and a second assembly configured to generate a static magnetic flux. The assemblies are constructed and arranged such that a radial air gap is located between the first assembly and the second assembly and such that during operation of the bone conduction device, the static magnetic flux flows through the radial air gap, whereby the dynamic magnetic flux and the static magnetic flux generate relative movement between the first assembly and the second assembly. No substantial amount of the dynamic magnetic flux flows through the radial air gap.

In accordance with another aspect of the present invention, there is a bone conduction device comprising a means for generating a dynamic magnetic flux, a means for generating a static magnetic flux, and a means for directing the dynamic magnetic flux and the static magnetic flux between the means for generating the dynamic magnetic flux and the means for generating the static magnetic flux to generate relative movement between the means for generating the dynamic magnetic flux and the means for generating the static magnetic flux.

In accordance with another aspect of the present invention, there is a method of imparting vibrational energy comprising moving a first assembly relative to a second assembly in an oscillatory manner via interaction of a dynamic magnetic flux and a static magnetic flux, directing the static magnetic flux through an air gap having a span that is constant with the movement of the first assembly relative to a second assembly, wherein a substantial amount of the dynamic magnetic flux does not flow through the at least one second air gap.

BRIEF DESCRIPTION OF THE DRAWINGS

Embodiments of the present invention are described below with reference to the attached drawings, in which.

DETAILED DESCRIPTION

Embodiments of the present invention are generally directed towards a bone conduction device configured to impart vibrational energy to a recipient's skull. The bone conduction device includes an electromagnetic actuator configured to vibrate in response to sound signals received by the bone conduction device. This imparts, to the recipient's skull, vibrations generated by the vibrating electromagnetic actuator. The electromagnetic actuator includes a bobbin assembly configured to generate a dynamic magnetic flux when energized by an electric current. The bobbin assembly includes a bobbin and a coil wrapped around the bobbin. The electromagnetic actuator further includes a counterweight assembly including two permanent magnets configured to generate a static magnetic flux. The two assemblies move relative to one another when the electromagnetic actuator vibrates.

In an embodiment, two axial air gaps and two radial air gaps are located between the bobbin assembly and the counterweight assembly. The electromagnetic actuator is configured such that during operation of the bone conduction device, both the dynamic magnetic flux and the static magnetic flux flow through at least one of the axial air gaps. However, during operation, only the static magnetic flux flows through one or more of the radial air gaps. The dynamic magnetic flux does not flow through the radial air gaps.

Thus, in accordance with this embodiment, the radial air gaps serve to close the static magnetic field generated by the permanent magnets. Further, as will be discussed in more detail below, the electromagnetic actuator may be configured such that the span of the radial air gap remains constant during operation of the bone conduction device, in contrast to the axial air gaps.

Further in accordance with this embodiment, the radial air gaps are implemented in the vibrating electromagnetic actuator such that a spring connecting the bobbin assembly to the counterweight assembly may be of a configuration such that the resonant frequency of the electromagnetic actuator is reduced relative to the electromagnetic actuator absent the radial air gaps. Moreover, a tendency of the static magnetic flux to drive the counterweight assembly away from a balance point of the vibrating electromagnetic actuator is reduced relative to the vibrating electromagnetic actuator absent the radial air gaps. Also, in accordance with this embodiment, the percentage of magnetic saturation in a core of the bobbin during operation of the vibrating electromagnetic actuator is reduced relative to the electromagnetic actuator absent the radial air gaps.

Figure 1:
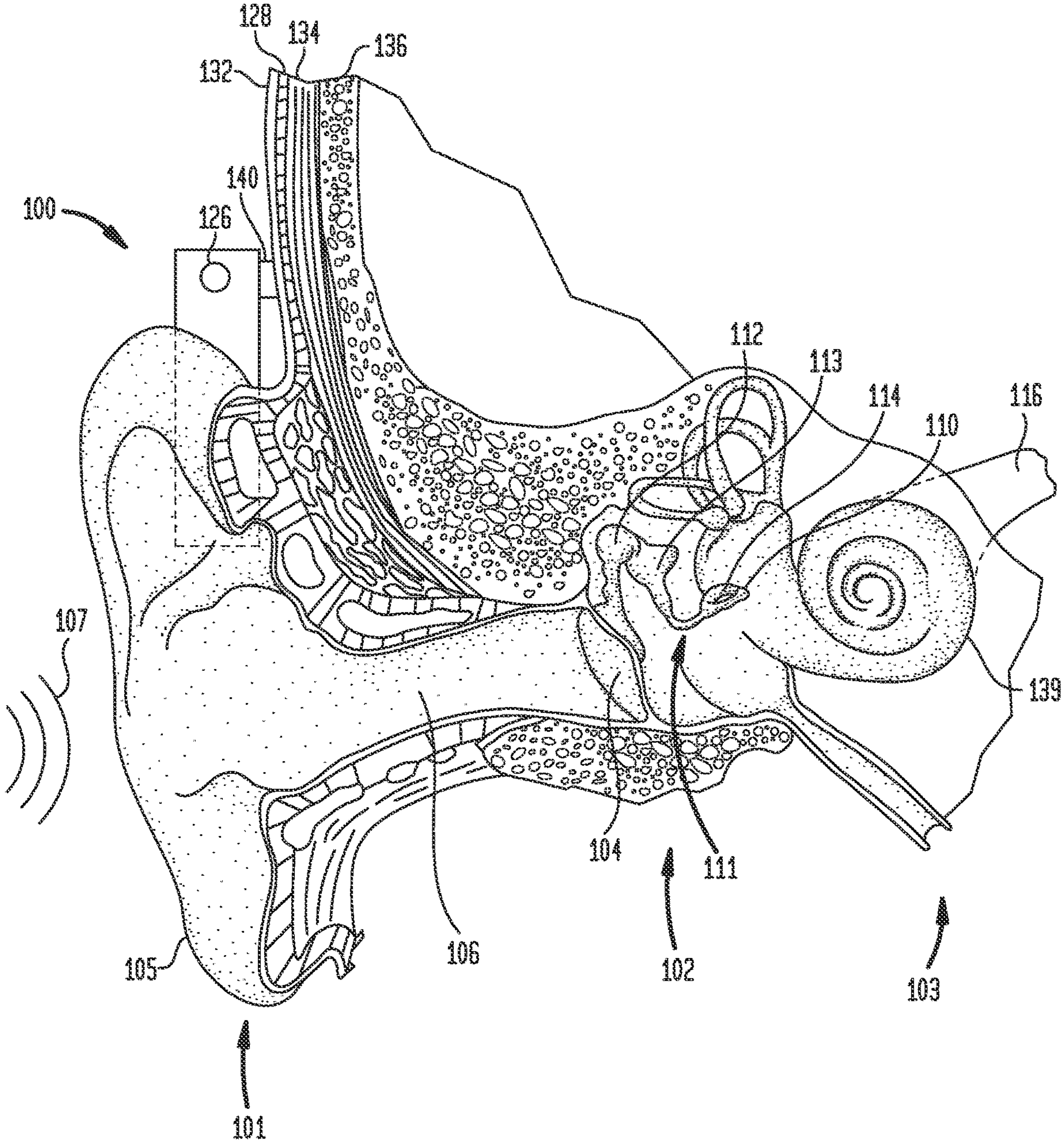
FIG. 1 is a perspective view of an exemplary bone conduction device in which embodiments of the present invention may be implemented.

FIG. 1 is a perspective view of a bone conduction device 100 in which embodiments of the present invention may be implemented. As shown, the recipient has an outer ear 101, a middle ear 102 and an inner ear 103. Elements of outer ear 101, middle ear 102 and inner ear 103 are described below, followed by a description of bone conduction device 100.

In a fully functional human hearing anatomy, outer ear 101 comprises an auricle 105 and an ear canal 106. A sound wave or acoustic pressure 107 is collected by auricle 105 and channeled into and through ear canal 106. Disposed across the distal end of ear canal 106 is a tympanic membrane 104 which vibrates in response to acoustic wave 107. This vibration is coupled to oval window or fenestra ovalis 110 through three bones of middle ear 102, collectively referred to as the ossicles 111 and comprising the malleus 112, the incus 113 and the stapes 114. The ossicles 111 of middle ear 102 serve to filter and amplify acoustic wave 107, causing oval window 110 to vibrate. Such vibration sets up waves of fluid motion within cochlea 139. Such fluid motion, in turn, activates hair cells (not shown) that line the inside of cochlea 139. Activation of the hair cells causes appropriate nerve impulses to be transferred through the spiral ganglion cells and auditory nerve 116 to the brain (not shown), where they are perceived as sound.

FIG. 1 also illustrates the positioning of bone conduction device 100 relative to outer ear 101, middle ear 102 and inner ear 103 of a recipient of device 100. As shown, bone conduction device 100 is positioned behind outer ear 101 of the recipient and comprises a sound input element 126 to receive sound signals. Sound input element may comprise, for example, a microphone, telecoil, etc. In an exemplary embodiment, sound input element 126 may be located, for example, on or in bone conduction device 100, or on a cable extending from bone conduction device 100.

Also, bone conduction device 100 comprises a sound processor (not shown), a vibrating electromagnetic actuator and/or various other operational components. More particularly, sound input device 126 (e.g., a microphone) converts received sound signals into electrical signals. These electrical signals are processed by the sound processor. The sound processor generates control signals which cause the actuator to vibrate. In other words, the actuator converts the electrical signals into mechanical motion to impart vibrations to the recipient's skull.

As illustrated, bone conduction device 100 further includes a coupling apparatus 140 configured to attach the device to the recipient. In the embodiment of FIG. 1, coupling apparatus 140 is attached to an anchor system (not shown) implanted in the recipient. An exemplary anchor system (also referred to as a fixation system) may include a percutaneous abutment fixed to the recipient's skull bone 136. The abutment extends from bone 136 through muscle 134, fat 128 and skin 132 so that coupling apparatus 140 may be attached thereto. Such a percutaneous abutment provides an attachment location for coupling apparatus 140 that facilitates efficient transmission of mechanical force. It will be appreciated that embodiments may be implemented with other types of couplings and anchor systems.

Figure 2:
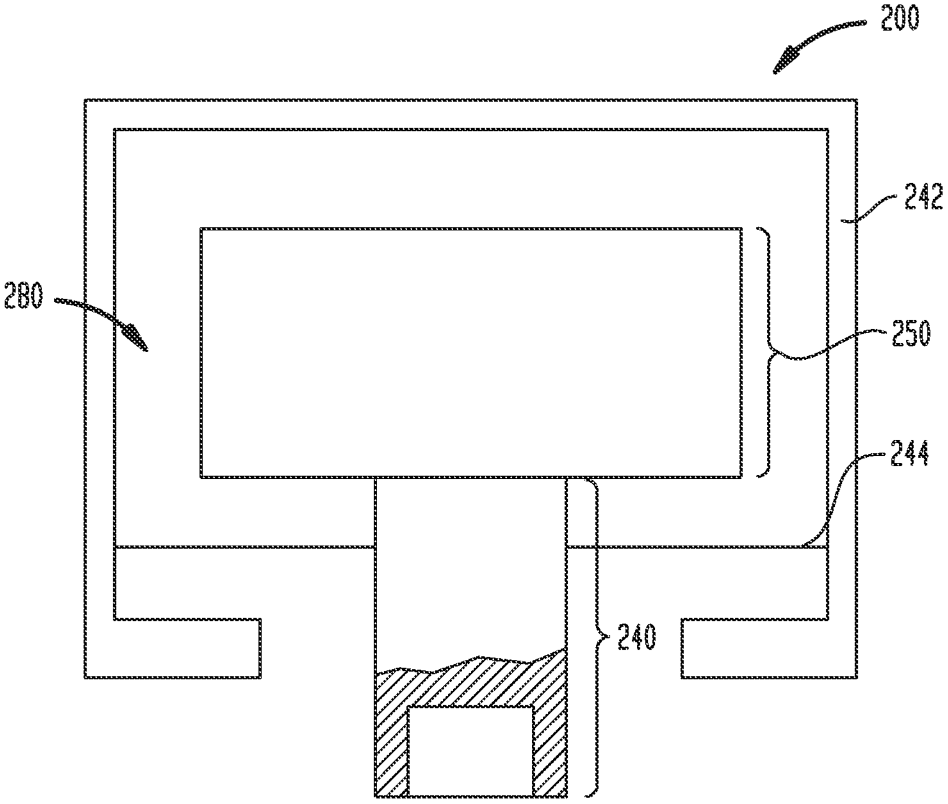
FIG. 2 is a schematic diagram illustrating certain components of a bone conduction device in accordance with an embodiment of the invention.

FIG. 2 is an embodiment of a bone conduction device 200 in accordance with an embodiment of the invention. Bone conduction device 200 includes a housing 242, a vibrating electromagnetic actuator 250, a coupling apparatus 240 that extends from housing 242 and is mechanically linked to vibrating electromagnetic actuator 250. Collectively, vibrating electromagnetic actuator 250 and coupling apparatus 240 form a vibrating actuator-coupling assembly 280. Vibrating actuator-coupling assembly 280 is suspended in housing 242 by spring 244. In an exemplary embodiment, spring 244 is connected to coupling apparatus 240, and vibrating electromagnetic actuator 250 is supported by coupling apparatus 240.

It is noted that while the embodiments presented herein are described with respect to a percutaneous bone conduction device, some or all of the teachings disclosed herein may be utilized in transcutaneous bone conduction devices and/or other devices that utilize a vibrating electromagnetic actuator. For example, embodiments of the present invention include active transcutaneous bone conduction systems utilizing the electromagnetic actuators disclosed herein and variations thereof where at least one active component (e.g. the electromagnetic actuator) is implanted beneath the skin. Embodiments of the present invention also include passive transcutaneous bone conduction systems utilizing the electromagnetic actuators disclosed herein and variations thereof where no active component (e.g., the electromagnetic actuator) is implanted beneath the skin (it is instead located in an external device), and the implantable part is, for instance a magnetic pressure plate. Some embodiments of the passive transcutaneous bone conduction systems according to the present invention are configured for use where the vibrator (located in an external device) containing the electromagnetic actuator is held in place by pressing the vibrator against the skin of the recipient. In an exemplary embodiment, an implantable holding assembly is implanted in the recipient that is configured to press the bone conduction device against the skin of the recipient. In other embodiments, the vibrator is held against the skin via a magnetic coupling (magnetic material and/or magnets being implanted in the recipient and the vibrator having a magnet and/or magnetic material to complete the magnetic circuit, thereby coupling the vibrator to the recipient).

Figure 3A:
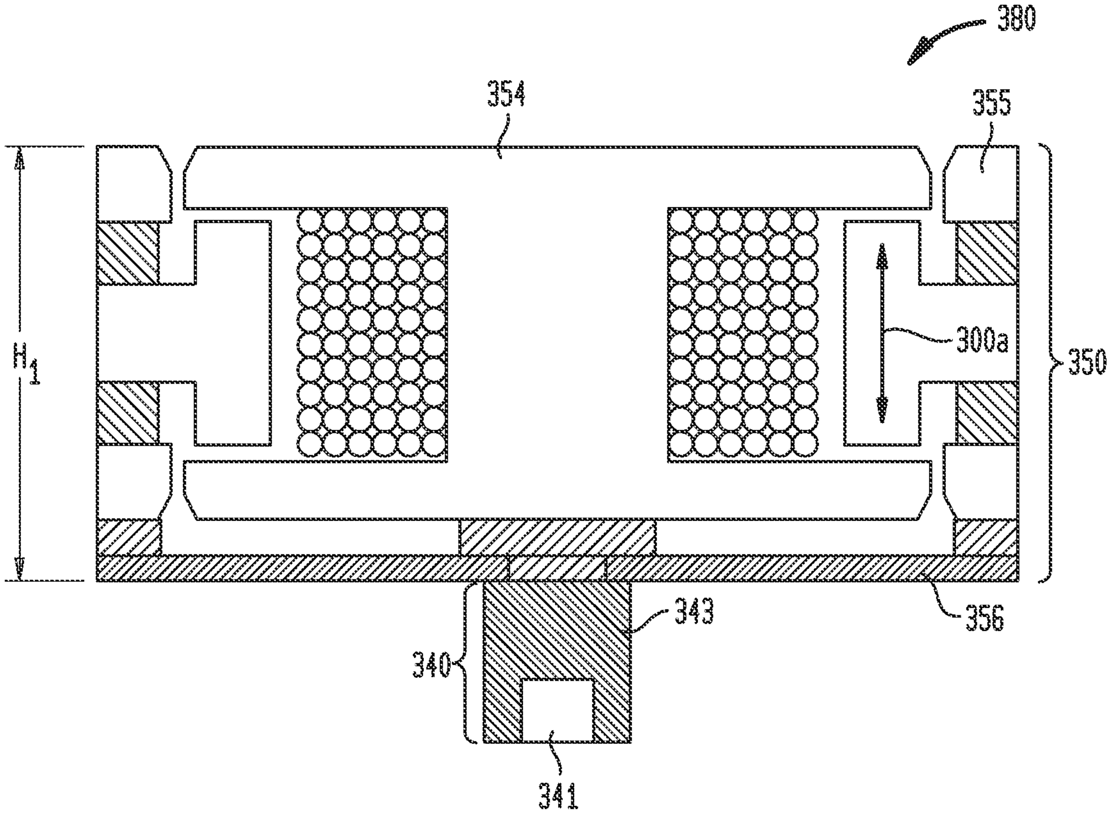
FIG. 3A is a cross-sectional view of an embodiment of a vibrating actuator-coupling assembly of the bone conduction device of FIG. 2.

FIG. 3A is a cross-sectional view of an embodiment of vibrating actuator-coupling assembly 380 according to an embodiment, which may correspond to vibrating actuator-coupling assembly 280 detailed above.

Coupling apparatus 340 includes a coupling 341 in the form of a snap coupling configured to "snap couple" to an anchor system on the recipient. As noted above with reference to FIG. 1, the anchor system may include an abutment that is attached to a fixture screw implanted into the recipient's skull and extending percutaneously through the skin so that snap coupling 341 can snap couple to a coupling of the abutment of the anchor system. In the embodiment depicted in FIG. 3A, coupling 341 is located at a distal end, relative to housing 242 if vibrating actuator-coupling assembly 380 were installed in bone conduction device 200 of FIG. 2 (i.e., 380 being substituted for element 280 of FIG. 2), of a coupling shaft 343 of coupling apparatus 340. In an embodiment, coupling 341 corresponds to coupling described in U.S. patent application Ser. No. 12/177,091 assigned to Cochlear Limited. In yet other embodiments, alternate couplings may be used, such as those discussed above.

Coupling apparatus 340 is mechanically coupled to vibrating electromagnetic actuator 350 configured to convert electrical signals into vibrations. In an exemplary embodiment, vibrating electromagnetic actuator 350 corresponds to vibrating electromagnetic actuator 250 detailed above. In operation, sound input element 126 (FIG. 1) converts sound into electrical signals. As noted above, the bone conduction device provides these electrical signals to a sound processor which processes the signals and provides the processed signals to the vibrating electromagnetic actuator 350, which then converts the electrical signals (processed or unprocessed) into vibrations. Because vibrating electromagnetic actuator 350 is mechanically coupled to coupling apparatus 340, the vibrations are transferred from vibrating electromagnetic actuator 350 to coupling apparatus 340 and then to the recipient via the anchor system (not shown).

Figure 3B:
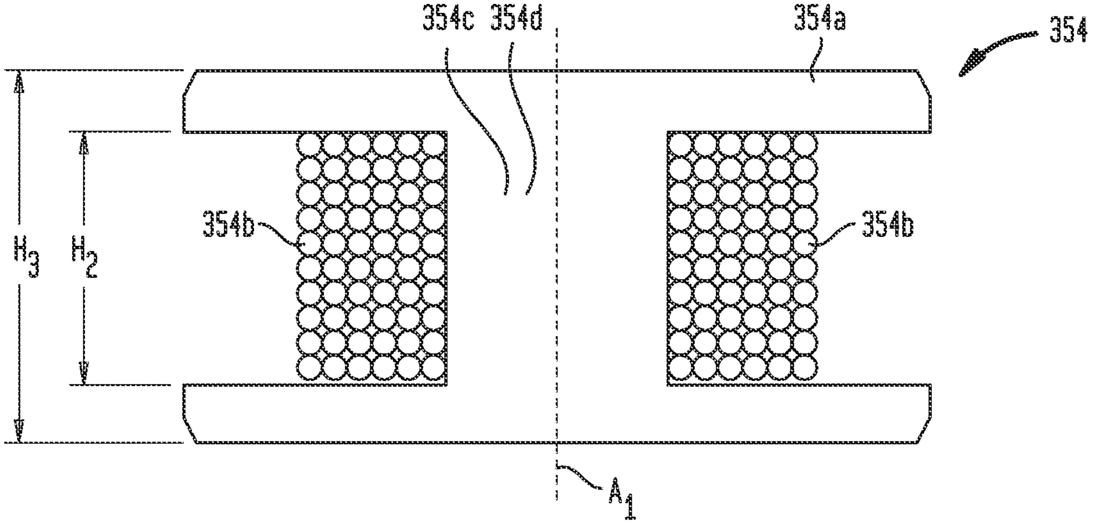
FIG. 3B is a cross-sectional view of the bobbin assembly of the vibrating actuator-coupling assembly of FIG. 3A.

As illustrated in FIG. 3A, vibrating electromagnetic actuator 350 includes a bobbin assembly 354, a counterweight assembly 355 and coupling apparatus 340. For ease of visualization, FIG. 3B depicts bobbin assembly 354 separately. As illustrated, bobbin assembly 354 includes a bobbin 354*a* and a coil 354*b* that is wrapped around a core 354*c* of bobbin 354*a*. In the illustrated embodiment, bobbin assembly 354 is radially symmetrical.

Figure 3C:
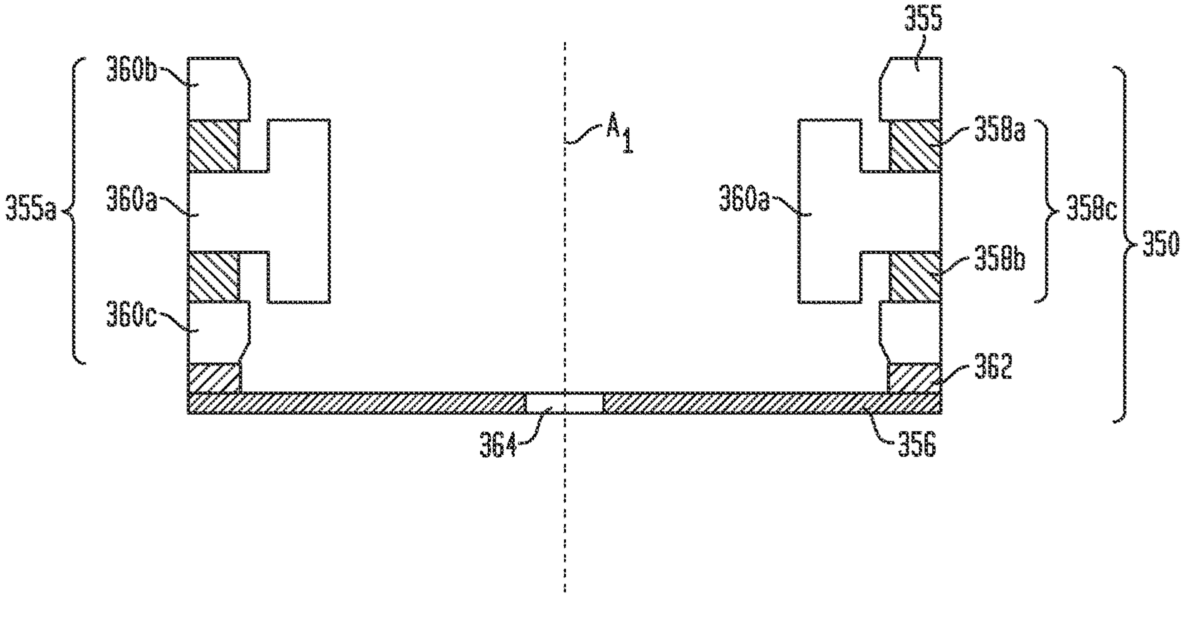
FIG. 3C is a cross-sectional view of the counterweight assembly of the vibrating actuator-coupling assembly of FIG. 3A.

FIG. 3C illustrates counterweight assembly 355 separately, for ease of visualization. As illustrated, counterweight assembly 355 includes spring 356, permanent magnets 358*a* and 358*b*, yokes 360*a*, 360*b* and 360*c*, and spacer 362. Spacer 362 provides a connective support between spring 356 and the other elements of counterweight assembly 355 just detailed. Spring 356 connects bobbin assembly 354 to the rest of counterweight assembly 355, and permits counterweight assembly 355 to move relative to bobbin assembly 354 upon interaction of a dynamic magnetic flux, produced by bobbin assembly 354. This dynamic magnetic flux is produced by energizing coil 354*b* with an alternating current. The static magnetic flux is produced by permanent magnets 358*a* and 358*b* of counterweight assembly 355, as will be described in greater detail below. In this regard, counterweight assembly 355 is a static magnetic field generator and bobbin assembly 354 is a dynamic magnetic field generator. As may be seen in FIGS. 3A and 3C, hole 364 in spring 356 provides a feature that permits coupling apparatus 341 to be rigidly connected to bobbin assembly 354.

It is noted that while embodiments presented herein are described with respect to a bone conduction device where counterweight assembly 355 includes permanent magnets 358*a* and 358*b* that surround coil 354*b* and moves relative to coupling apparatus 340 during vibration of vibrating electromagnetic actuator 350, in other embodiments, the coil may be located on the counterweight assembly 355 as well, thus adding weight to the counterweight assembly 355 (the additional weight being the weight of the coil).

As noted, bobbin assembly 354 is configured to generate a dynamic magnetic flux when energized by an electric current. In this exemplary embodiment, bobbin 354*a* is made of a soft iron. Coil 354*b* may be energized with an alternating current to create the dynamic magnetic flux about coil 354*b*. The iron of bobbin 354*a* is conducive to the establishment of a magnetic conduction path for the dynamic magnetic flux. Conversely, counterweight assembly 355, as a result of permanent magnets 358*a* and 358*b*, in combination with yokes 360*a*, 360*b* and 360*c*, which are made from a soft iron, generate, due to the permanent magnets, a static magnetic flux. The soft iron of the bobbin and yokes may be of a type that increase the magnetic coupling of the respective magnetic fields, thereby providing a magnetic conduction path for the respective magnetic fields.

Figure 3D:
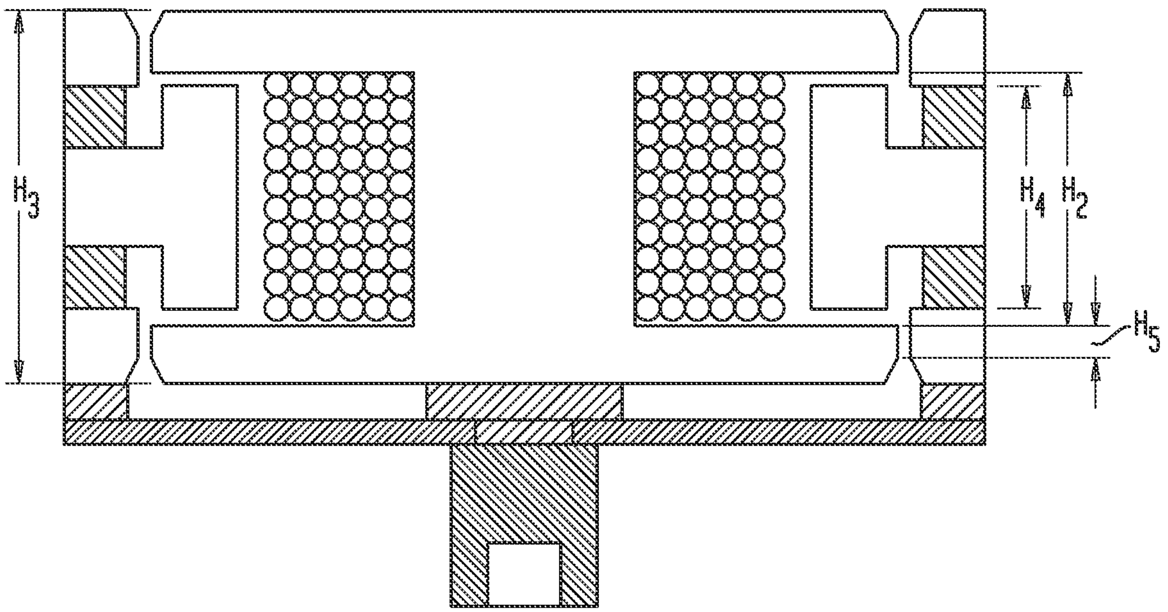
FIG. 3D provides further details of the cross-sectional view of FIG. 3A.
Figure 3E:
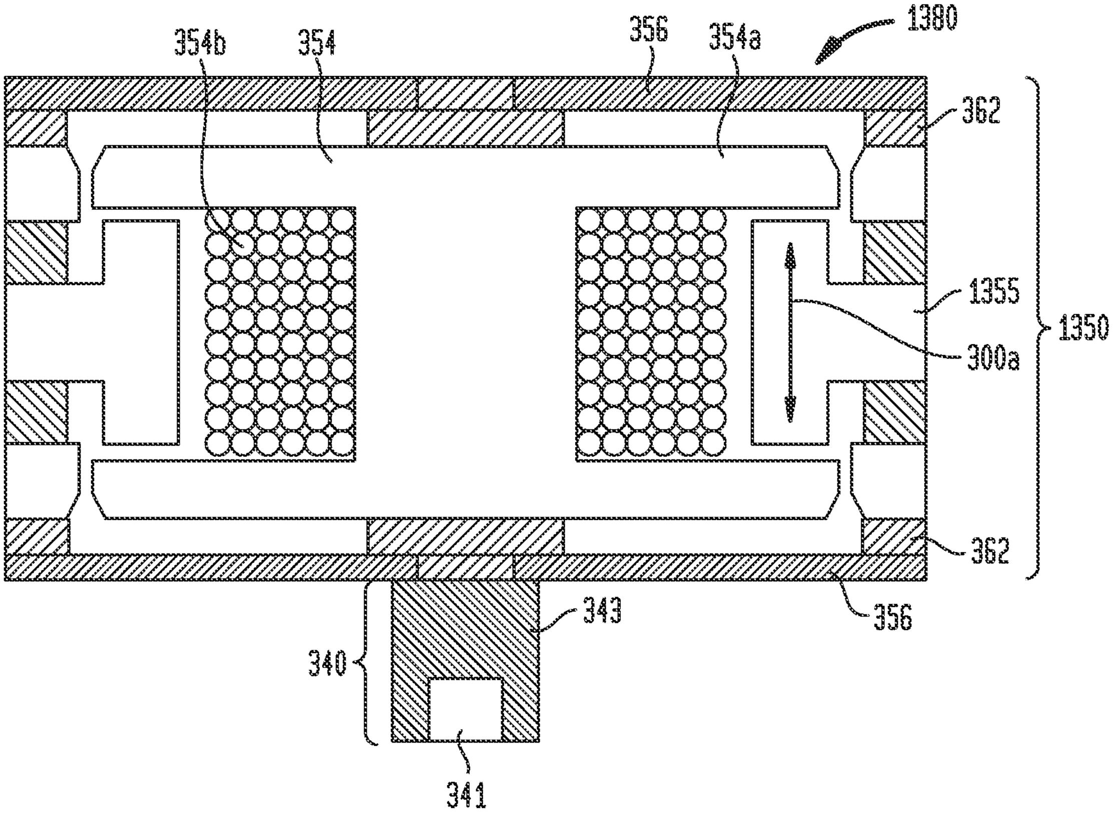
FIG. 3E is a cross-sectional view of an alternate embodiment of a vibrating actuator-coupling assembly of the bone conduction device of FIG. 2.
Figure 4:
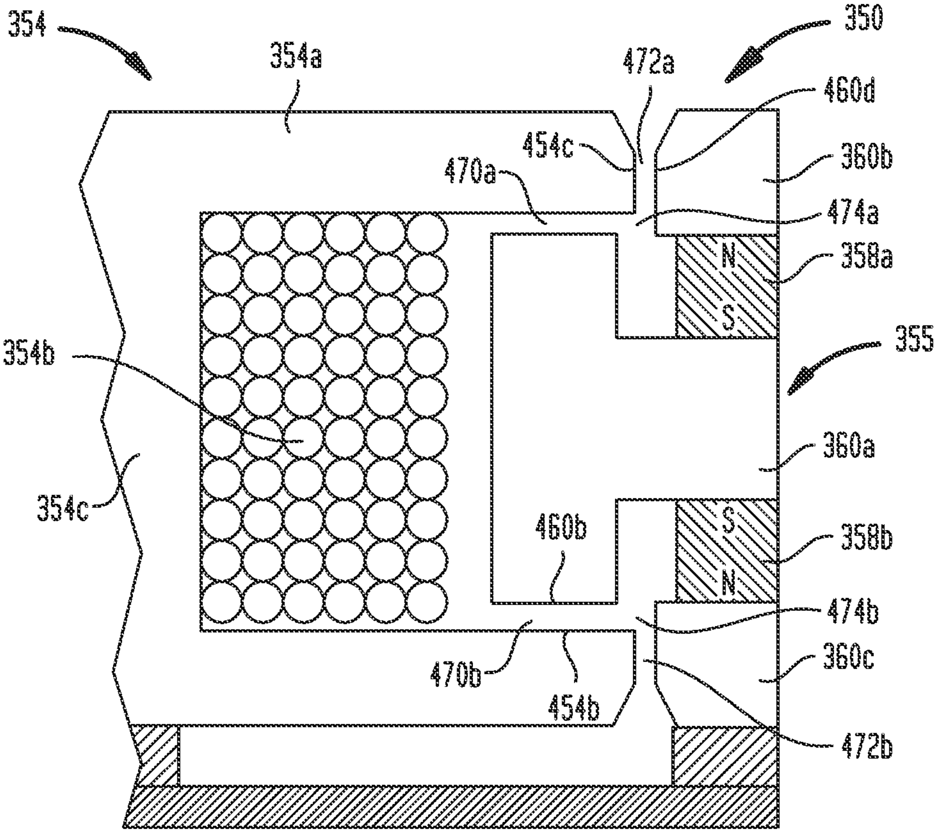
FIG. 4 is a schematic diagram of a portion of the vibrating actuator-coupling assembly of FIG. 3A.

FIG. 4 depicts a portion of FIG. 3A. As may be seen, vibrating electromagnetic actuator 350 includes two axial air gaps 470*a* and 470*b* that are located between bobbin assembly 354 and counterweight assembly 355. As used herein, the phrase "axial air gap" refers to an air gap that has at least a component that extends on a plane normal to the direction of relative movement (represented by arrow 300*a* in FIG. 3A) between bobbin assembly 354 and counterweight assembly 355 such that the air gap is bounded by the bobbin assembly 354 and counterweight assembly 355 in the direction of relative movement between the two. Accordingly, the phrase "axial air gap" is not limited to an annular air gap, and encompasses air gaps that are formed by straight walls of the components (which may be present in embodiments utilizing bar magnets and bobbins that have a non-circular (e.g. square) core surface). With respect to a radially symmetrical bobbin assembly 354 and counterweight assembly 355, cross-sections of which are depicted in FIGS. 3A-4, air gaps 470*a* and 470*b* extend in the direction of relative movement between bobbin assembly 354 and counterweight assembly 355, air gaps 470*a* and 470*b* are bounded as detailed above in the "axial" direction. With respect to FIG. 4, the boundaries of axial air gap 470*b* are defined by surface 454*b* of bobbin 354*a* and surface 460*b* of yoke 360*a*.

Further as may be seen in FIG. 4, the vibrating electromagnetic actuator 350 includes two radial air gaps 472*a* and 472*b* that are located between bobbin assembly 354 and counterweight assembly 355. As used herein, the phrase "radial air gap" refers to an air gap that has at least a component that extends on a plane normal to the direction of relative movement between bobbin assembly 354 and counterweight assembly 355 such that the air gap is bounded by bobbin assembly 354 and counterweight assembly 355 in a direction normal to the direction of relative movement between the two (represented by arrow 300*a* in FIG. 3A). Accordingly, the phrase "radial air gap" is not limited to an annular air gap, and encompasses air gaps that are formed by straight walls of the pertinent components (which, as just noted, may be present in embodiments utilizing bar magnets and bobbins that have a non-circular (e.g. square) core surface). With respect to a radially symmetrical bobbin assembly 354 and counterweight assembly 355, the air gap extends about the direction of relative movement between bobbin assembly 354 and counterweight assembly 355, the air gap being bounded as detailed above in the "radial" direction. With respect to FIG. 4, the boundaries of radial air gap 472*a* are defined by surface 454*c* of bobbin 454*a* and surface 460*d* of yoke 360*b*. As may be seen with reference to FIG. 4, respective axial air gaps 470*a*, 470*b* are adjacent at least one respective radial air gaps 472*a*, 472*b*, respective air gaps 470*a*, 470*b* intersecting with radial air gaps 472*a*, 472*b* at locations 474*a* and 474*b*, respectively.

As may be seen in FIG. 4, the permanent magnets 358*a* and 358*b* are arranged such that their respective south poles face each other and their respective north poles face away from each other. It is noted that in other embodiments, the respective south poles may face away from each other and the respective north poles may face each other.

Figure 5A:
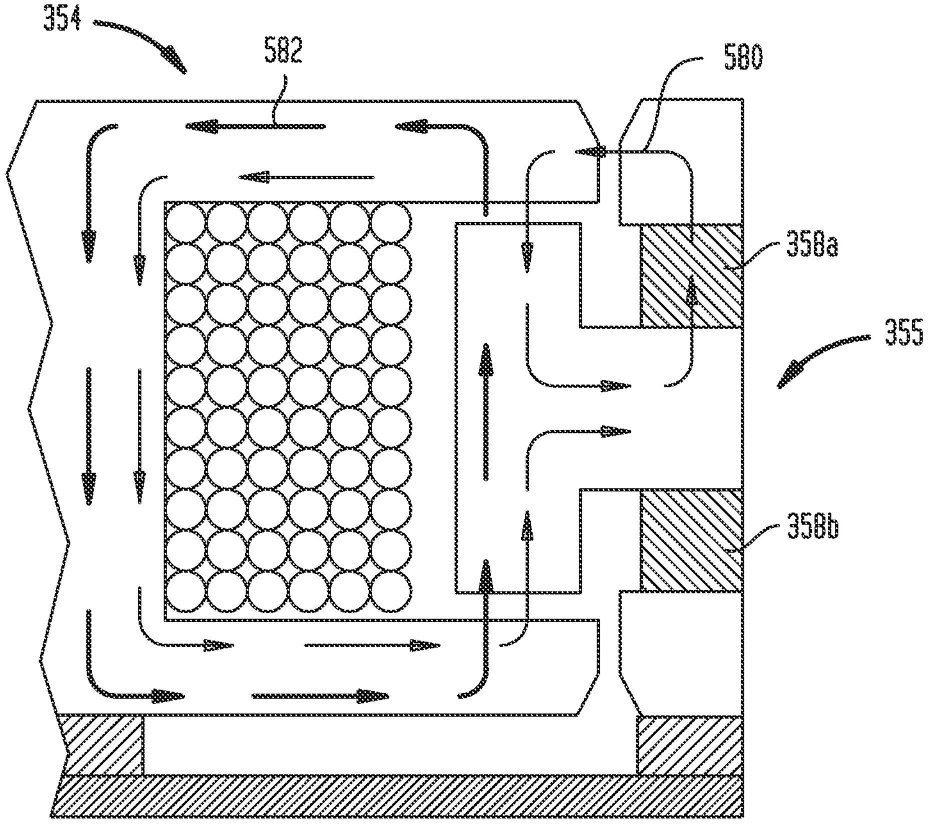
FIGS. 5A and 5B are schematic diagrams detailing static and dynamic magnetic flux in the vibrating actuator-coupling assembly at the moment that the coils are energized when the bobbin assembly and the counterweight assembly are at a balance point with respect to magnetically induced relative movement between the two.
Figure 5B:
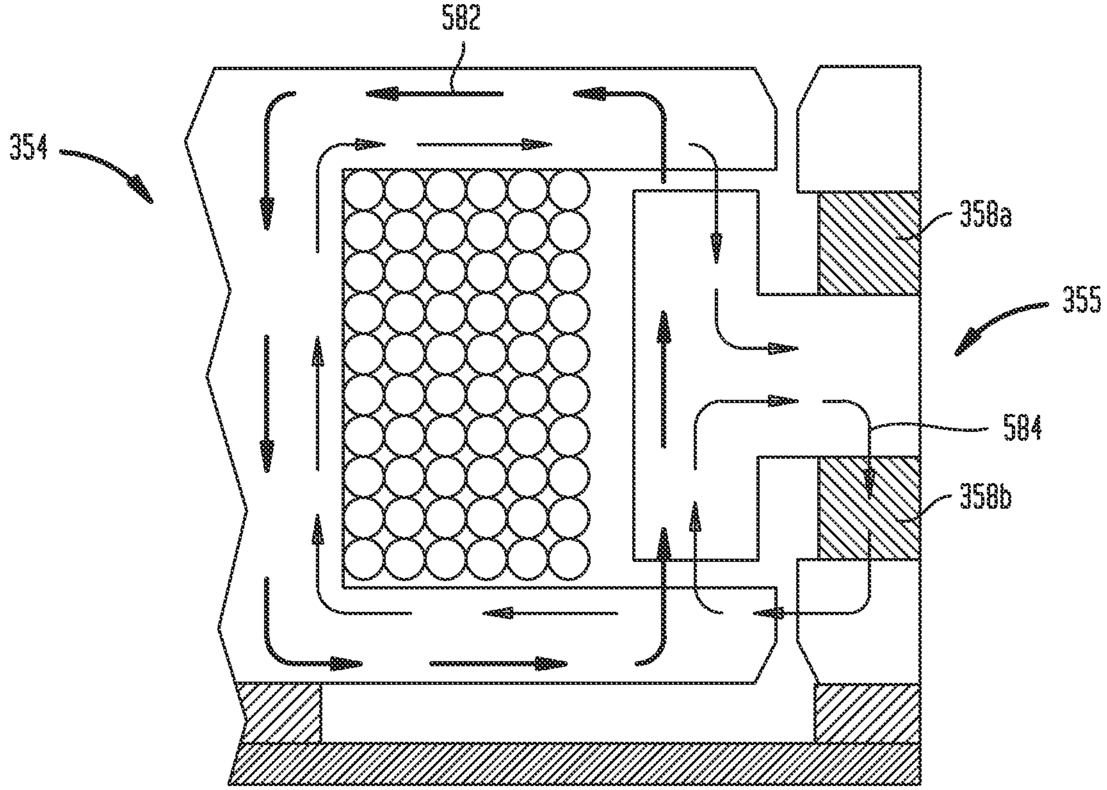

FIG. 5A is a schematic diagram detailing static magnetic flux 580 of permanent magnet 358*a* and dynamic magnetic flux 582 of coil 354*b* in vibrating actuator-coupling assembly 380 at the moment that coil 354*b* is energized and when bobbin assembly 354 and counterweight assembly 355 are at a balance point with respect to magnetically induced relative movement between the two (hereinafter, the "balance point"). That is, while it is to be understood that the counterweight assembly 355 moves in an oscillatory manner relative to the bobbin assembly 354 when the coil 354*b* is energized, there is an equilibrium point at the fixed location corresponding to the balance point at which the counterweight assembly 354 returns to relative to the bobbin assembly 354 when the coil 354*b* is not energized. Note that there is also a static magnetic flux 584 of permanent magnet 358*b*, which is not shown in FIG. 5A for the sake of clarity. Instead, FIG. 5B shows static magnetic flux 584 but not static magnetic flux 580. It will be recognized that static magnetic flux 584 of FIG. 5B may be superimposed onto the schematic of FIG. 5A to reflect the static magnetic flux of vibrating electromagnetic actuator 350 (combined static magnetic fluxes 580 and 584).

As just noted, FIGS. 5A and 5B depict magnetic fluxes at the moment that coil 354*b* is energized and when bobbin assembly 354 and counterweight assembly 355 are at the balance point. It is noted that FIGS. 5A and 5B do not depict the magnitude/scale of the magnetic fluxes. Indeed, in some embodiments of the present invention, at the moment that coil 354*b* is energized and when bobbin assembly 354 and counterweight assembly 355 are at the balance point, relatively little, if any, static magnetic flux flows through the core 354*c* of the bobbin 354*a*/the hole 354*d* of the coil 354*b* formed as a result of the coil 354*b* being wound about the core 354*c* of the bobbin 354*a*. During operation, the amount of static magnetic flux that flows through these components increases as the bobbin assembly 354 travels away from the balance point (both downward and upward away from the balance point) and decreases as the bobbin assembly 354 travels towards the balance point (both downward and upward towards the balance point).

As may be seen from FIGS. 5A and 5B, radial air gaps 472*a* and 472*b* close static magnetic flux 580 and 584. It is noted that the phrase "air gap" refers to a gap between the component that produces a static magnetic field and a component that produces a dynamic magnetic field where there is a relatively high reluctance but magnetic flux still flows through the gap. The air gap closes the magnetic field. In an exemplary embodiment, the air gaps are gaps in which little to no material having substantial magnetic aspects is located in the air gap. Accordingly, an air gap is not limited to a gap that is filled by air. For example, as will be described in greater detail below, the radial air gaps may be filled with a viscous fluid such as a viscous liquid. Still further, the radial air gaps may be in the form of a non-magnetic material, such as a non-magnetic spring, which may replace and/or supplement spring 356. However, in some embodiments, the spring 356 may be made of a magnetic material, and vibrating electromagnetic actuator 350 may be configured such that the spring 356 closes the static magnetic field in lieu of and/or in addition to one or more of the radial air gaps.

In vibrating electromagnetic actuator 350 of FIG. 3A, no net magnetic force is produced at the radial air gaps. The depicted magnetic fluxes 580, 582 and 584 of FIGS. 5A and 5B will magnetically induce movement of counterweight assembly 355 downward (represented by the direction of arrow 600*a* in FIG. 6A) relative to bobbin assembly 354 so that vibrating actuator-coupling assembly 380 will ultimately correspond to the configuration depicted in FIG. 6A. More specifically, vibrating electromagnetic actuator 350 of FIG. 3A is configured such that during operation of vibrating electromagnetic actuator 350 (and thus operation of bone conduction device 200), an effective amount of the dynamic magnetic flux 582 and an effective amount of the static magnetic flux (flux 580 combined with flux 584) flow through at least one of axial air gaps 470*a* and 470*b* and an effective amount of the static magnetic flux 582 flows through at least one of radial air gaps 472*a* and 472*b* sufficient to generate substantial relative movement between counterweight assembly 355 and bobbin assembly 354.

As used herein, the phrase "effective amount of flux" refers to a flux that produces a magnetic force that impacts the performance of vibrating electromagnetic actuator 350, as opposed to trace flux, which may be capable of detection by sensitive equipment but has no substantial impact (e.g., the efficiency is minimally impacted) on the performance of the vibrating electromagnetic actuator. That is, the trace flux will typically not result in vibrations being generated by the electromagnetic actuator 350.

Further, as may be seen in FIGS. 5A and 5B, the static magnetic flux (580 combined with 584) enters bobbin 354*a* substantially only at locations lying on and parallel to a tangent line of the path of the dynamic magnetic flux 582. As will be described below, the amount of static magnetic flux that travels through core 354*c*/hole 354*d* in coil 354*b* while the counterweight assembly 355 is away from the balance point is significantly reduced due to the presence of radial air gaps 472*a* and 472*b* as compared to actuators that do not have radial air gaps 472*a* and 472*b* (such as in the scenario where the gaps are closed by a magnetic material and/or in a scenario where the radial air gaps are replaced with a respective number of additional axial air gaps).

As may be seen from FIGS. 5A and 5B, the dynamic magnetic flux is directed to flow outside the radial air gaps 472*a* and 472*b*. In particular, no substantial amount of the dynamic magnetic flux 582 passes through radial air gaps 472*a* and 472*b* or through the two permanent magnets 358*a* and 358*b* of counterweight assembly 355. Moreover, as may be seen from the figures, the static magnetic flux (580 combined with 584) is produced by no more than two permanent magnets 358*a* and 358*b*. This has the effect of providing a vibrating electromagnetic actuator 350 that is compact in that it has a relatively small height $H_1$ (see FIG. 3A), lighter (which may have additional utility vis-à-vis, for example, a passive transcutaneous bone conduction device wherein a lighter vibrator reduces the tendency for the vibrator to move away from the coupling location and/or a less powerful magnetic coupling can be utilized to hold the vibrator in place because the vibrator weights less), and generally more efficient, as will be described in greater detail below. It is noted that in some embodiments, one or more of these features and/or other features result in, in some embodiments, a vibrating electromagnetic actuator that has a relative smaller volume/lower volume than a comparable electromagnetic actuator.

Figure 6A:
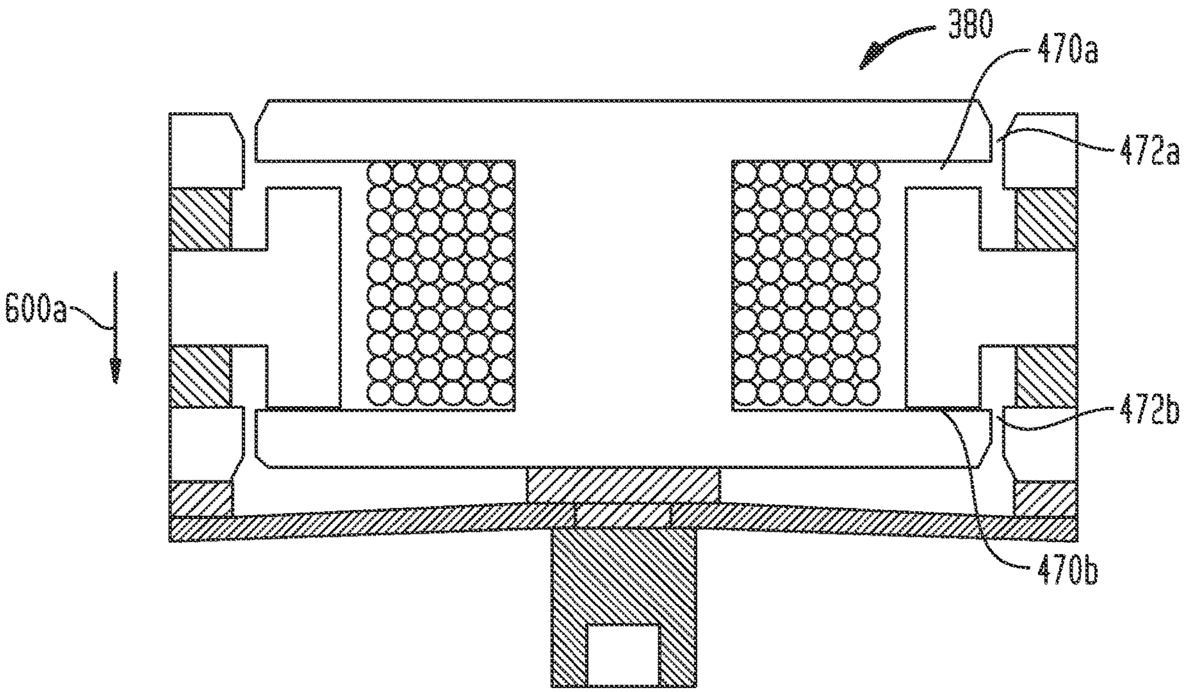
FIG. 6A is a schematic diagram depicting movement of the counterweight assembly relative to the bobbin assembly of the vibrating actuator-coupling assembly of FIG. 3A.

As counterweight assembly 355 moves downward relative to bobbin assembly 354, as depicted in FIG. 6A, the span of axial air gap 470*a* increases and the span of axial air gap 470*b* decreases. This has the effect of substantially reducing the amount of effective static magnetic flux through axial air gap 470*a* and increasing the amount of effective static magnetic flux through axial air gap 470*b*. However, in some embodiments, the amount of effective static magnetic flux through radial air gaps 472*a* and 472*b* substantially remains about the same with respect to the flux when counterweight assembly 355 and bobbin assembly 354 are at the balance point. (Conversely, as detailed below, in other embodiments the amount is different.) This is because the distance (span) between surfaces 454*c* and 460*d* with respect to air gap 472*a* and the distance between the corresponding surfaces of air gap 472*b* remains the same, and the movement of the surfaces (upward/downward with respect to FIGS. 6A and 6B) does not substantially misalign the surfaces to substantially impact the amount of effective static magnetic flux through radial air gaps 472*a* and 472*b*. That is, the respective surfaces sufficiently face one another to not substantially impact the flow of flux.

Referring to FIG. 3A and FIG. 4, as previously noted, radial air gaps 472*a* and 472*b* are bounded on one side by respective surfaces 454*c* of bobbin 354*a* and respective surfaces 460*d* of counterweight assembly 355. Surfaces 454*c* are located at the maximum outer diameter of bobbin 354*a* when measured on a plane normal to the direction (represented by arrow 300*a* in FIG. 3A) of the generated substantial relative movement of counterweight assembly 355 relative to bobbin assembly 354. However, in other embodiments, this may not be the case. For example, in some embodiments, only one of radial air gaps 472*a* and 472*b* are located at this maximum outer diameter.

Upon reversal of the direction of the dynamic magnetic flux, the dynamic magnetic flux will flow in the opposite direction about coil 354*b*. However, the general directions of the static magnetic flux will not change. Accordingly, such reversal will magnetically induce movement of counterweight assembly 355 upward (represented by the direction of arrow 600*b* in FIG. 6B) relative to bobbin assembly 354 so that vibrating actuator-coupling assembly 380 will ultimately correspond to the configuration depicted in FIG. 6B. As counterweight assembly 355 moves upward relative to bobbin assembly 354, the span of axial air gap 470*b* increases and the span of axial air gap 470*a* decreases. This has the effect of reducing the amount of effective static magnetic flux through axial air gap 470*b* and increasing the amount of effective static magnetic flux through axial air gap 470*a*. However, the amount of effective static magnetic flux through radial air gaps 472*a* and 472*b* does not change due to a change in the span of the axial air gaps as a result of the displacement of the counterweight assembly 355 relative to the bobbin assembly 354 for the reasons detailed above with respect to downward movement of counterweight assembly 355 relative to bobbin assembly 354.

Some specific configurations of an exemplary embodiment of a vibrating electromagnetic actuator such as actuator 350 will now be described.

In an exemplary embodiment, the span of the radial air gaps (i.e., distance between the surfaces forming the radial air gaps) is about the same as the span of the axial air gaps and/or about the same as the maximum distance that counterweight assembly 355 moves away from the balance point. In an alternate exemplary embodiment, the span of the radial air gaps is about the same order of magnitude as the span of the axial air gaps and/or about the same order of magnitude as the maximum distance that counterweight assembly 355 moves away from the balance point.

In an exemplary embodiment, the span of the radial air gaps is about the same as the span of the axial air gaps.

In an exemplary embodiment of the present invention, the resonant frequency of vibrating electromagnetic actuator 355 is about 200 kHz to 1000 kHz. In some embodiments, the resonant frequency is about 200 kHz to 300 kHz, about 300 kHz to 400 kHz, about 400 kHz to 500 kHz or about 500 kHz to 600 kHz. This permits a spring 356 having a relatively low spring constant to be utilized, thus improving efficiency as compared to a vibrating electromagnetic actuator 355 having spring with a relatively higher spring constant.

Because the radial air gaps have a relatively lower tendency to collapse as compared to the axial air gaps, the spring constant need not be as high as might be the case in the absence of the radial air gaps (i.e., only axial air gaps being present, discussed in greater detail below). The spring 356 serves to provide a driving force on the counterweight assembly 355 back towards the balance point (it resists movement away from the balance point), and also permits movement of counterweight assembly 355 relative to bobbin assembly 354 subject to the spring constant of spring 356. Some embodiments of vibrating electromagnetic actuator 350 are configured such that there is less tendency for counterweight assembly 355 to move away from the balance point (in the absence of a dynamic magnetic flux), relative to other vibrating electromagnetic actuator designs. That is, while the permanent magnets will impart a static magnetic flux that will tend to push counterweight assembly 355 away from the balance point, a force required to counter this static magnetic flux will be relatively low, thus permitting a relatively flexible spring 356 to be utilized in vibrating electromagnetic actuator 350, thereby improving the efficiency of the vibrating electromagnetic actuator 350. Alternatively or in addition to this, as will be discussed in greater detail below, the use of the radial air gaps as disclosed herein decreases the tendency for the counterweight assembly 355 to stick at the top and bottom of its travel relative to the bobbin assembly 354. Accordingly, the decrease in tendency permits the use of a more flexible spring 356. The ability to adequately utilize a relatively flexible spring 356 permits a design in which the resonant frequency of vibrating electromagnetic actuator 350 is relatively lower to that with a stiffer spring 356.

The effects of the use of the radial air gaps may be seen in an exemplary embodiment where the radial air gaps are annular radial air gaps having a diameter when measured from about the middle of the span of the radial air gaps 472*a*/472*b* of about 12 mm and having a height of about 4 mm, the collective spring has a spring constant of about 140 N/mm. As used herein, the "height" of a radial air gap is defined as the distance in the direction of relative movement of the counterweight assembly 355 relative to the bobbin assembly 354 along which the surfaces (e.g., 454*c* and 460*d* with respect to radial air gap 472*a*) of the counterweight assembly 355 and bobbin assembly 354 that form the radial air gaps face each other (represented by $H_5$ in FIG. 3D).

In the embodiment of FIGS. 3A-4, the static magnetic flux (580 combined with 584) is produced by a set 358*c* of only two permanent magnets 358*a* and 358*b*, as depicted in the FIGs. In other embodiments, additional permanent magnets may be included in set 358*c*. Further, in the embodiment depicted in FIGS. 3A-3C, counterweight assembly 355 and bobbin assembly 354 are rotationally symmetric about axis $A_1$. That is, for example, permanent magnets 358*a* and 358*b* are annular magnets. However, in other embodiments, counterweight assembly 355 and bobbin assembly 354 are not rotationally symmetric about axis $A_1$ For example, permanent magnets 358*a* and 358*b* may be bar magnets that extend into and out of the page of FIG. 3C.

In an exemplary embodiment, with reference to FIGS. 3B and 3D, the height ($H_2$ with reference to FIGS. 3B and 3D) of coil 354*b* is about the same as or greater than the height ($H_4$ with reference to FIG. 3D) of the set 358*c* of the permanent magnets. In this example, the permanent magnets of the set 358*c* are substantially located, when measured parallel to the direction of the height (arrow $H_2$ with reference to FIGS. 3B and 3D) of coil 354*b*, in between the extrapolated top and the bottom of coil 354*b* (represented by the dimension lines of arrow $H_2$ with reference to FIGS. 3B and 3D) when bobbin assembly 354 and counterweight assembly 355 are at the balance point. In an alternate exemplary embodiment, still with reference to FIGS. 3A-3C, the height ($H_3$ with reference to FIGS. 3B and 3D) of bobbin 354*a* is about the same as or greater than the height ($H_4$ with reference to FIG. 3D) of the set 358*c* of the permanent magnets. In this regard, still referring to the just mentioned figures, the permanent magnets of the set 358*c* are substantially located, when measured parallel to the direction of the height (arrow $H_3$ with reference to FIG. 3B) of the bobbin 354*a*, in between the extrapolated top and the bottom of the bobbin 354*a* (represented by the dimension lines of arrow $H_3$ with reference to FIGS. 3B and 3D) when bobbin assembly 355 and counterweight assembly 354 are at the balance point. That is, the permanent magnets of the set 358*c* are substantially located within the extrapolated dimension $H_3$ of the bobbin 354*a*.

FIG. 3E presents an alternate embodiment of a vibrating actuator-coupling assembly 1380 according to an alternate embodiment. As illustrated in FIG. 3E, vibrating electromagnetic actuator 1350 includes a bobbin assembly 354, a counterweight assembly 1355 and coupling apparatus 340. However, counterweight assembly 1355 differs from counterweight assembly 355 of the embodiment of FIG. 3A in that a second spring 356 is located on the counterweight assembly 1355, as may be seen in FIG. 3E. In an embodiment, the vibrating electromagnetic actuator 1350 is horizontally symmetrical, save for the coupling assembly components, as may be seen from FIG. 3E.

As previously noted, counterweight assembly 355 includes a yoke assembly 355*a* comprising one or more yokes (360*a*, 360*b* and 360*c*). These yokes may be made of iron conducive to the establishment of a magnetic conduction path for the static magnetic flux. As may be seen from FIGS. 5A and 5B, with reference to a plane parallel to and lying on the direction of the generated substantial relative movement of counterweight assembly 355 relative to bobbin assembly 354, the static magnetic flux enters yoke assembly 355*a*, flows through yoke assembly 355*a* and exits yoke assembly 355*a* while only passing through no more than four cross-sections of permanent magnets 358*a* and 358*b*. The four cross-sections depicted in FIGS. 5A and 5B correspond to two permanent magnets in the case of annular magnets as depicted in the figures and four cross-sections corresponding to four permanent magnets in the case of bar magnets). All of the yokes of yoke assembly 355*a*, when measured parallel to the direction of the height of the coil (arrow $H_2$ with respect to FIG. 3B) are substantially located in between the extrapolated top and the bottom of bobbin 354*a* (represented by the dimension lines of arrow $H_3$ with reference to FIGS. 3B and 3D) when bobbin assembly 354 and counterweight assembly 355 are at the balance point. Further, the locations at which static magnetic flux 582 enters and exits yoke assembly 355, when measured parallel to the direction of the height of the coil (arrow $H_2$ with respect to FIG. 3B), are located in between the extrapolated top and the bottom (represented by the dimension lines of arrow $H_3$ with reference to FIGS. 3B and 3D) of the bobbin 354*b* when bobbin assembly 354 and counterweight assembly 355 are at the balance point.

In a further exemplary embodiment, all permanent magnets of counterweight assembly 355 that are configured to generate the static magnetic flux 582 are located to the sides of the bobbin assembly 355. Along these lines, such permanent magnets may be annular permanent magnets with respective interior diameters that are greater than the maximum outer diameter of the bobbin 354*a*, when measured on the plane normal to the direction (represented by arrow 300*a* in FIG. 3A) of the generated substantial relative movement of the counterweight assembly 355 relative to the bobbin assembly 354, as illustrated in FIG. 3A.

In some embodiments of the present invention, the configuration of the counterweight assembly 354 reduces or eliminates the inaccuracy of the distance (span) between faces of the air gaps due to the permissible tolerances of the dimensions of the permanent magnets. In this regard, the respective spans of the axial air gaps 470*a* and 470*b* are not dependent on the thicknesses of the permanent magnets 358*a* and 358*b* when measured when the bobbin assembly 354 and the counterweight assembly 355 are at the balance point.

It is noted that while the surfaces creating the radial air gaps (e.g., surfaces 454*c* and 460*d* with respect to air gap 472*a*) are depicted as uniformly flat, in other embodiments, the surfaces may be partitioned into a number of smaller mating surfaces. It is further noted that the use of the radial air gaps permits relative ease of inspection of the radial air gaps from the outside of the vibrating electromagnetic actuator 350, in comparison to, for example the axial air gaps.

Certain performance features of some exemplary embodiments of the present invention will now be described.

Figure 7A:
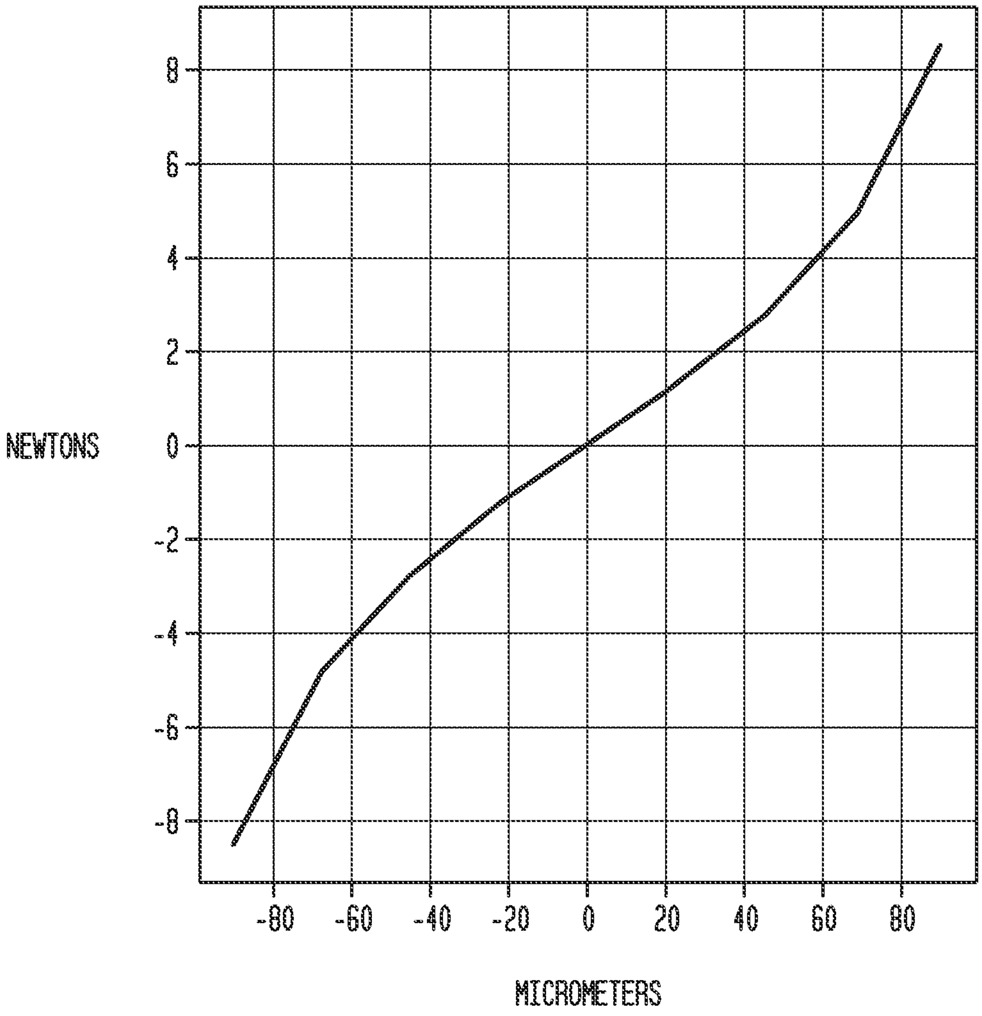
FIG. 7A presents a graph of electromagnetic force vs. Z component (deflection from the balance point) for an exemplary embodiment of a vibrating electromagnet actuator in accordance with an embodiment of the invention.

FIG. 7A depicts a graph of electromagnetic force to Z component (deflection from the balance point) for an exemplary embodiment of the vibrating electromagnet actuator 350. Specifically, the X axis depicts deflection of the bobbin assembly 355 from the balance point and the Y axis depicts the electromagnetic force in Newtons necessary to move the bobbin assembly 355 a corresponding distance. As will be understood, a given distance of movement of the bobbin assembly 355 from the balance point corresponds to a reduction in the span in one of the axial air gaps and an increase in the span of the opposite axial air gap by the same given distance. Along these lines, as may be seen from FIG. 7A, the static magnetic force of the vibrating electromagnetic actuator sufficient to reduce the span of at least one of the axial air gaps by about 85 micrometers, is about 8 Newtons.

Figure 7B:
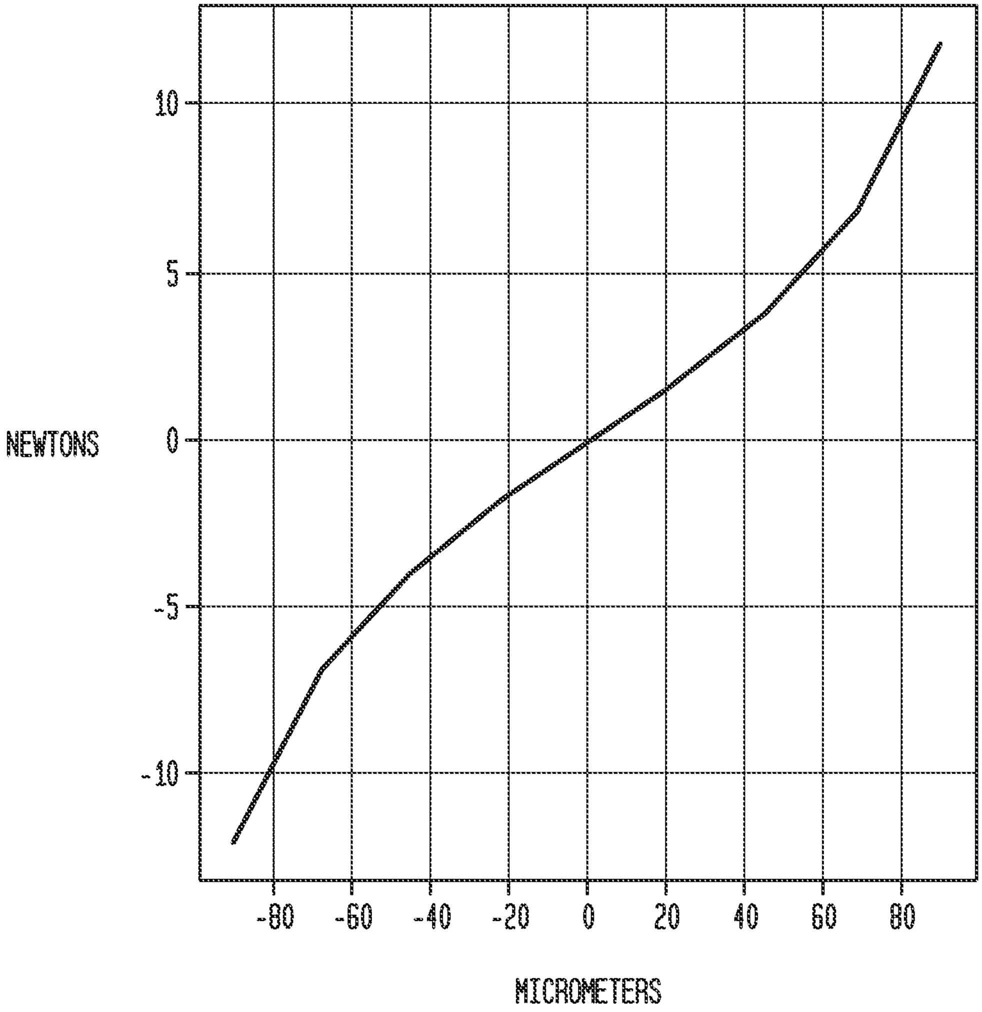
FIG. 7B presents a graph of electromagnetic force vs. Z component (deflection from the balance point) for a vibrating electromagnet actuator in which radial air gaps have been eliminated.

As previously noted, the use of the radial air gaps may reduce the static magnetic force associated with a given movement relative to that which would be required in the absence of the radial air gaps and the radial air gaps being substituted with additional axial air gaps to close the static magnetic field between the bobbin assembly 354 and the counterweight assembly 355. Along these lines, FIG. 7B presents a graph paralleling the information of FIG. 7A. The graph of FIG. 7B presents data for a vibrating electromagnetic actuator substantially duplicative of actuator 350 except that the radial air gaps have been eliminated and additional axial air gaps have been added to close the static magnetic field between the bobbin assembly 354 and the counterweight assembly 355. As may be seen, the static magnetic force of the vibrating electromagnetic actuator 350 sufficient to reduce the span of at least one of the axial air gaps by about 85 micrometers is about 35% less than the static magnetic force of the vibrating electromagnetic actuator 350 required to move in the absence of the radial air gaps. That is, if the radial air gaps were not present, the static magnetic force would be about 50% higher to obtain the comparable movement (e.g., axial air gap reduction/increase). In some exemplary embodiments, the reduction in the required static magnetic force is due to the increased reluctance to the flow of the static magnetic flux into bobbin assembly 354 from the counterweight assembly 355 resulting from the radial air gaps. In the absence of the radial air gaps (and closure of the static magnetic field with additional radial air gaps), the reluctance at the respective axial air gaps decreases as the counterweight assembly 355 moves relative to the bobbin assembly 355 (i.e., span of one of the axial air gaps is significantly reduced due to movement of the counterweight assembly 354), resulting in an increased flow of static magnetic flux into the bobbin assembly 354 in general, and into the core 354*c* in particular. This increases the required static magnetic force needed to obtain a comparable movement of the counterweight assembly 355. Further, this creates a tendency for the counterweight assembly 355 to stick at the top and bottom of its travel relative to the bobbin assembly 354.

Because of the radial air gaps, a significant air gap is always present between the yokes of the counterweight assembly 355 and the bobbin of the bobbin assembly 354, and, therefore, the amount of the static magnetic flux directed though the hole 354*d* of the coil 354*b* and through the core 354*c* of the bobbin 354 is substantially less. This increases the efficiency because the magnetic material of the core 354*c* is not as magnetically saturated as it otherwise might be, and the dynamic flux produced by the bobbin assembly is not as inhibited as it otherwise might be (inhibition due to the increased magnetic saturation). In an exemplary embodiment, the relative reduction in the amount of static magnetic flux directed thorough the hole 354*d* permits a core 354*c* of relative reduced thickness (measured in the horizontal direction relative to FIG. 3A), thus making the bobbin assembly 354*a* lighter and smaller. Also, a smaller bobbin assembly 354*a* may result in the resistance associated with respective turns of the wire forming the coil 354*b* being relatively reduced, thus improving efficiency of the vibrating electromagnetic actuator 350.

Figure 6B:
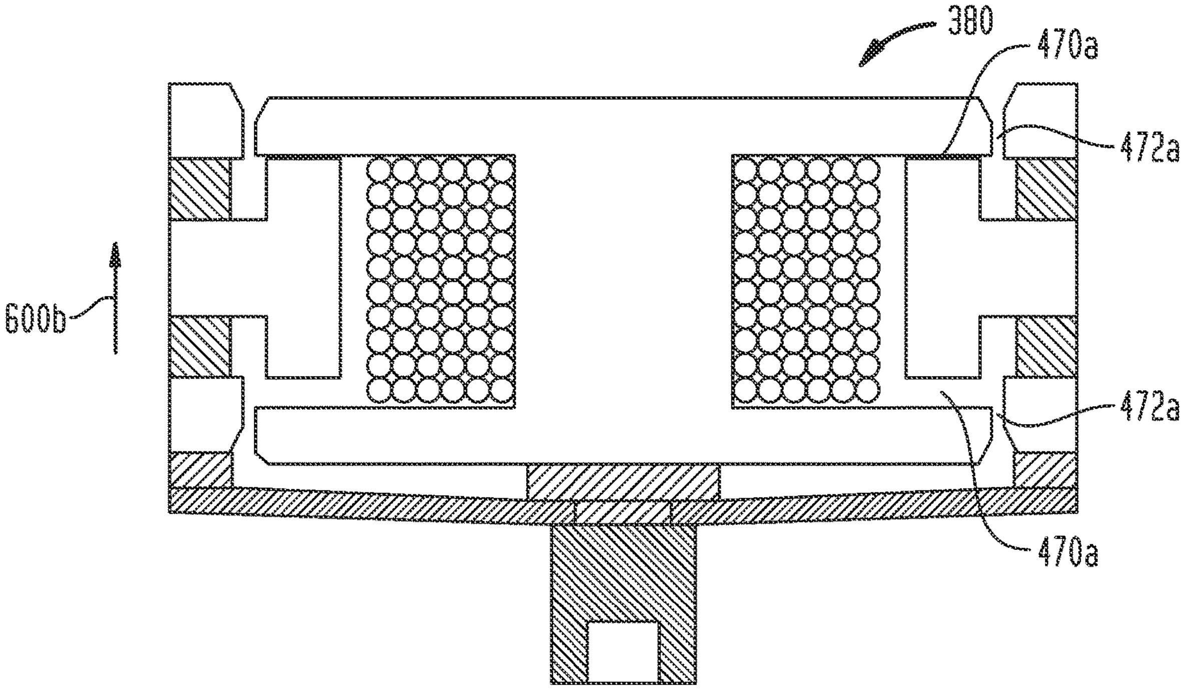
FIG. 6B is a schematic diagram depicting movement of the counterweight assembly relative to the bobbin assembly of the vibrating actuator-coupling assembly of FIG. 3A in the opposite direction of that depicted in FIG. 5A.

It is noted that in some embodiments, the reluctance at the radial air gaps is substantially constant through the range of movements of the counterweight assembly 355 relative to the bobbin assembly 354. In some embodiments, this is because, unlike the axial air gaps, the distance between the radial air gaps (span) is effectively constant during the range of movements of the counterweight assembly 355 relative to bobbin assembly 354. This may prevent magnetic saturation in the core of the bobbin. However, in other embodiments, the reluctance at the radial air gaps may increase with movement of the counterweight assembly 355 away from the balance point. In this regard, the faces of the radial air gaps move with respect to one another, and proper dimensioning of the yoke assembly 355*a* and the bobbin 355*a* can limit the amount of overlap between the faces during movement. By way of example, if the facing surfaces forming the radial air gaps (e.g., 454*c* and 460*d* with respect to radial air gap 372*a*) have a sufficiently small height (i.e., the dimension of the surfaces in the direction of arrow 300*a* of FIG. 3A) that the relative movement substantially reduces the area of the faces that face one another (as depicted in FIGS. 6A and 6B), there will be less area for the static magnetic flux to flow through, thus increasing reluctance as this area is reduced due to the relative movement of the counterweight assembly 355 to the bobbin assembly 354. In an exemplary embodiment, the air gaps are dimensioned such that the reluctance at radial air gap 472*a* is substantially the same as the reluctance at radial air gap 472*b* through the range of movements of the counterweight assembly relative to the bobbin assembly. Accordingly, in some embodiments, as reluctance varies in one radial air gap, the reluctance will vary in the same way at the other radial air gap.

Figure 8A:
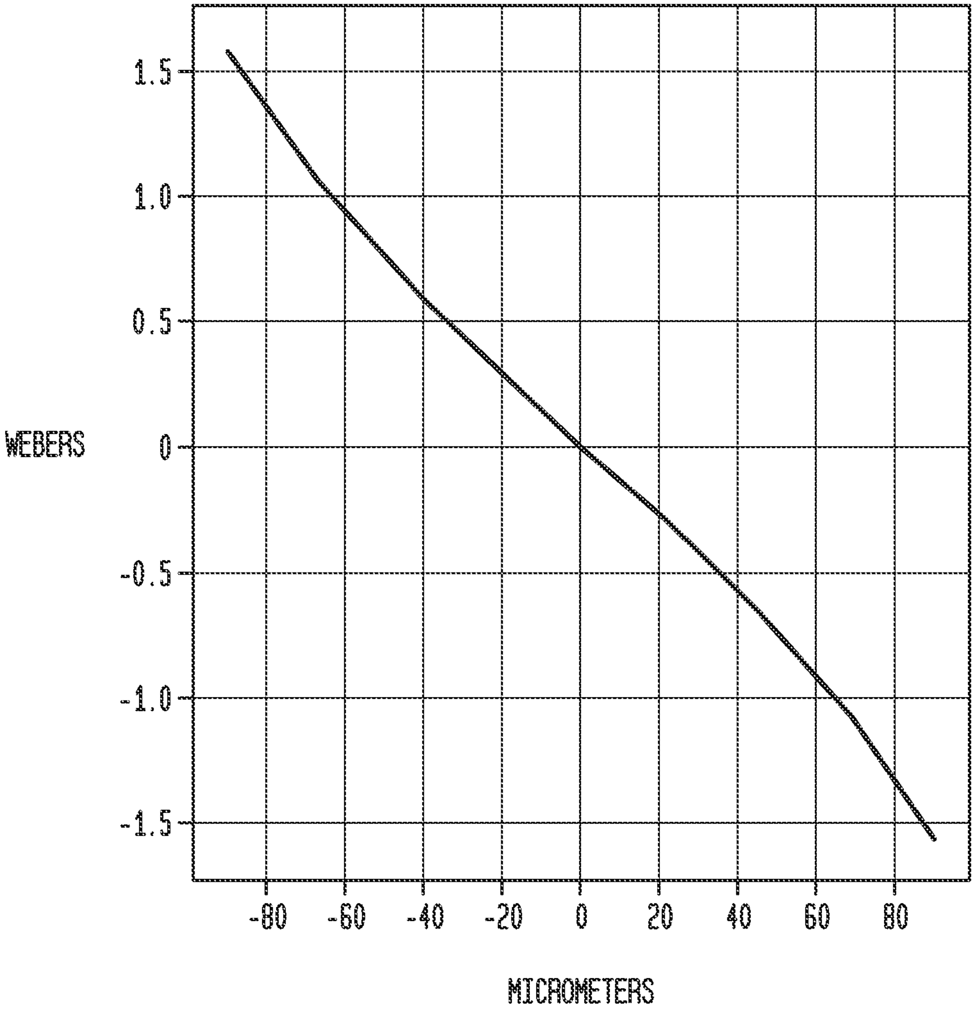
FIG. 8A depicts a graph of magnetic flux in a core of a bobbin vs. Z component (deflection from the balance point) for an exemplary embodiment of the vibrating electromagnet actuator in accordance with an embodiment of the invention.

FIG. 8A presents a graph of the magnetic flux in the core 354$c$ of the bobbin 354$a$ vs. the Z component (deflection from the balance point) for an exemplary embodiment of a vibrating electromagnet actuator 350. Specifically, the X axis depicts deflection of the bobbin assembly 355 from the balance point and the Y axis depicts the magnetic flux in the core 354$c$ corresponding to the force necessary to move the bobbin assembly 355 a corresponding distance. As may be seen from FIG. 8A, the magnetic flux in the core 354$c$ of the vibrating electromagnetic actuator, upon the application of a dynamic magnetic flux sufficient to deflect the counterweight assembly 355 relative to the bobbin assembly 354 by about 85 micrometers (i.e., reduce the span of at least one of the axial air gaps by about 85 micrometers), is about 0.0015 Webers.

Figure 8B:
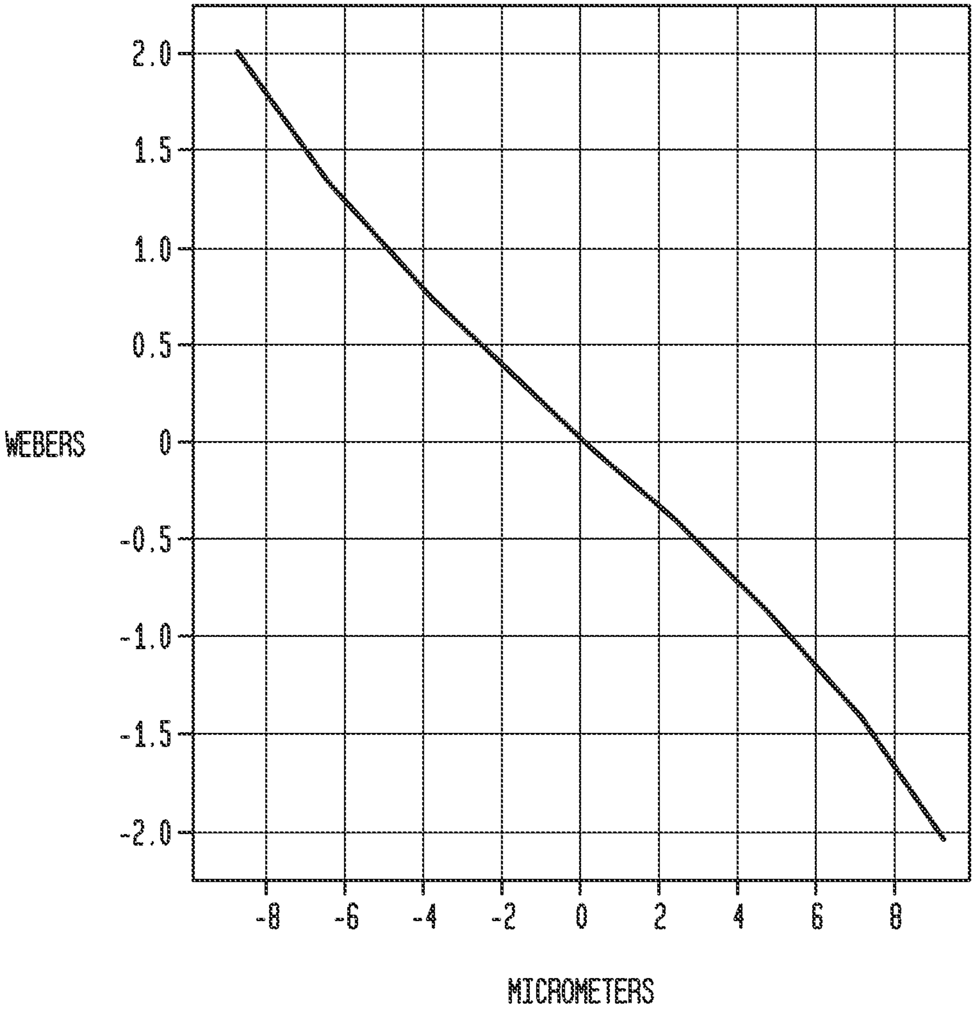
FIG. 8B depicts a graph of magnetic flux in a core of a bobbin vs. Z component (deflection from the balance point) for a vibrating electromagnet actuator in which radial air gaps have been eliminated.

As noted above, in some embodiments of the present invention, the use of the radial air gaps reduce the amount of static magnetic flux flowing through the core. FIG. 8B presents a graph paralleling the information of FIG. 8A, but which presents data for a vibrating electromagnetic actuator substantially duplicative of actuator 350 except that the radial air gaps have been eliminated and replaced with a respective number of additional axial air gaps. As may be seen, the static magnetic flux directed though the hole 354$d$ of the coil 354$b$ and through the core 354$c$ of the bobbin 354$a$, in the absence of the radial air gaps where axial air gaps have been instead substituted to close the static magnetic field is about 0.002 Webers upon the presence of a dynamic magnetic flux sufficient to reduce the span of at least one of the axial air gaps by about 85 micrometers. That is, the presence of radial air gaps may reduce the static magnetic flux directed through the hole 354$d$ of the coil 354$b$ (i.e., through the core 354$c$ of the bobbin 354$a$) by about 25% of that which would be present in the absence of the radial air gaps upon reduction of the span of the same respective air gaps by the same distance.

In an embodiment of the present invention, the collective distance of the spans of all axial air gaps through which effective amounts of static and dynamic magnetic flux flow are substantially no more than a maximum distance of the generated relative movement of the counterweight assembly 355 to the bobbin assembly 354. In an exemplary embodiment, this has the effect of reducing the total volume of fluid (e.g., air) that is displaced from the axial air gaps during movement of the counterweight assembly 355 relative to the bobbin assembly 354. Because the fluid in the axial air gaps acts to provide resistance to the relative movement of the counterweight assembly 355 relative to the bobbin assembly 354, this has an effect analogous to stiffening the spring 356, thus increasing the resonant frequency of the vibrating electromagnetic actuator 350.

In some exemplary embodiments, a viscous fluid may be located in the radial air gaps. Because the span of the radial air gaps does not change, only shear effects are seen in the radial air gaps as a result of movement of the counterweight assembly 355 relative to the bobbin assembly 354. This permits fluid damping, which may reduce the risk of acoustic feedback problems in the bone conduction device. In this regard, the teachings of U.S. Pat. No. 7,242,786 with respect to fluid damping may be implemented with respect to the radial air gaps to achieve some and/or all of the results detailed in that patent. For example, a ferromagnetic fluid may be interposed in the radial air gaps, the magnetic fields holding the ferromagnetic fluid in place.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method of imparting vibrational energy, comprising:

moving a first assembly relative to a second assembly in an oscillatory manner via interaction of a dynamic magnetic flux and a static magnetic flux; and directing a substantial amount of the dynamic magnetic flux to flow outside of a first air gap having a span that is constant with the movement of the first assembly relative to the second assembly.

2. The method of claim 1, wherein:

the first assembly includes a bobbin and a coil, the bobbin having a core, wherein the coil is wrapped around the core of the bobbin;

the second assembly includes at least one permanent magnet; and the method further comprises:

maintaining the span of the first air gap at a constant length during the oscillatory movement of the first assembly relative to the second assembly, thereby preventing magnetic saturation in the core of the bobbin.

3. The method of claim 1, further comprising:

directing the dynamic magnetic flux and the static magnetic flux through a second air gap having a span that is varying with the movement of the first assembly relative to the second assembly; and directing the static magnetic flux through the first air gap having the span that is constant with the movement of the first assembly relative to a second assembly.

4. The method of claim 1, wherein:

the first assembly and the second assembly are part of an electromagnetic actuator configured to hold the first assembly at a fixed location relative to the second assembly in the absence of the dynamic magnetic flux; and the movement of the first assembly relative to the second assembly in an oscillatory manner has an equilibrium point at the fixed location.

5. The method of claim 1, wherein a substantial amount of the dynamic magnetic flux does not flow through the first air gap.

6. A method of evoking a hearing percept, comprising:

capturing a sound;

transducing the captured sound into an electrical signal;

generating a dynamic magnetic flux based on the electrical signal; and directing the dynamic magnetic flux to interact with a static magnetic flux, thereby generating relative movement between two components, wherein the action of directing the dynamic magnetic flux includes directing the dynamic magnetic flux across a first air gap, wherein a width of the first air gap varies with relative movement between the two components, and the static magnetic flux crosses a second air gap having a width that is substantially constant during relative movement of the two components.

7. The method of claim 6, wherein:

the action of directing the dynamic magnetic flux includes directing the dynamic magnetic flux across a third air gap in addition to the first air gap, wherein a width of the third air gap varies with relative movement between the two components in an opposite manner as the variation of the width of the first air gap.

8. The method of claim 6, wherein:

the action of directing the dynamic magnetic flux includes directing the dynamic magnetic flux across a group of variable air gaps consisting of the first air gap and a third air gap in addition to the first air gap, wherein a width of the third air gap varies with relative movement between the two components in an opposite manner as the variation of the width of the first air gap.

9. The method of claim 6, wherein:

the static magnetic flux and the dynamic magnetic flux interact at the first air gap, and wherein the dynamic magnetic flux is generated by a first of the two components and the static magnetic flux is generated by a second of the two components at locations parallel to one another with respect to a direction of relative movement of the two components when the dynamic magnetic flux interacts with the static magnetic flux.

10. An electromagnetic transducer for a bone conduction device, comprising:

a first assembly configured to generate a dynamic magnetic flux, and a second assembly configured to generate a static magnetic flux;

wherein the first assembly and the second assembly are constructed and arranged such that a radial air gap is located between the first assembly and the second assembly, and the second assembly is moving relative to the first assembly.

11. The electromagnetic transducer of claim 10, wherein:

the electromagnetic transducer is configured such that during operation of the electromagnetic actuator, the static magnetic flux flows through the radial air gap, whereby the dynamic magnetic flux and the static magnetic flux generate the relative movement between the first assembly and the second assembly, and wherein no substantial amount of the dynamic magnetic flux flows through the radial air gap.

12. The electromagnetic transducer of claim 11, wherein:

the second assembly includes two permanent magnets; and the first assembly is configured to generate the dynamic magnetic flux when energized by an electric current.

13. The electromagnetic transducer of claim 12, wherein:

the second assembly includes two permanent magnets;

the first assembly includes a bobbin made of magnetic conductive material and a coil wrapped around the bobbin; and the static magnetic flux is produced by only the two permanent magnets.

14. The electromagnetic transducer of claim 11, wherein:

two radial air gaps are located between the first assembly and the second assembly; and a reluctance at a first of the two radial air gaps is substantially the same as the reluctance at a second of the two radial air gaps through the range of movements of the second assembly relative to the first assembly.

15. The electromagnetic transducer of claim 11, wherein:

the second assembly includes a yoke assembly comprising one or more yokes, the one or more yokes being made of iron conducive to the establishment of a magnetic conduction path for the static magnetic flux; and with reference to a plane parallel to the direction of the generated relative movement of the second assembly relative to the first assembly, the electromagnetic transducer is configured such that the static magnetic flux enters the yoke assembly, flows through the yoke assembly and exits the yoke assembly while passing through no more than two permanent magnets.

16. A bone conduction device, comprising:

the electromagnetic transducer of claim 10, wherein, the bone conduction device is configured such that the electromagnetic actuator vibrates in response to sound signals.

17. The electromagnetic transducer of claim 10, wherein:

the radial air gap is located at a first end of the first and second assemblies relative to a second end of the first and second assemblies opposite the first end;

the radial air gap is established by respective parallel surfaces of the first and second assemblies; and the electromagnetic transducer is configured to enable the relative movement of the first assembly relative to the second assembly during actuation such that the first assembly moves in a direction from the first end towards the second end in a manner that at least one of the surfaces is fully shadowed by the other of the surface during the full range of downward movement.

18. A hearing prosthesis, comprising:

the electromagnetic transducer of claim 10; and a housing that houses the electromagnetic transducer, wherein the electromagnetic transducer is configured to enable the relative movement of the first assembly relative to the second assembly in an oscillatory manner when the transducer is energized to result in a bone conduction hearing percept, the medical device is configured such that, when the prosthesis is attached to a person for evoking a hearing percept, most of the first assembly and the second assembly are located above a skull surface when evoking a hearing percept.

19. The electromagnetic transducer of claim 10, wherein:

the electromagnetic transducer is configured such that, when energized, the static magnetic flux is directed through the radial air gap with the relative movement of the first assembly relative to the second assembly, and the electromagnetic transducer includes at least one axial air gap; and collective distance of the spans of all axial air gaps of the assembly through which the static magnetic flux and the dynamic magnetic flux flow are substantially no more than a maximum distance of the generated relative movement of the second assembly to the first assembly.

20. The electromagnetic transducer of claim 10, wherein:

the radial air gap is established by respective parallel surfaces of the first and second assemblies that are respectively bounded by other respective surfaces that extend away from the respective surfaces of the parallel surfaces.

* * * * *